United States Patent
Willemsen

(10) Patent No.: US 8,766,427 B2
(45) Date of Patent: Jul. 1, 2014

(54) RF-POWER DEVICE

(75) Inventor: Marnix Bernard Willemsen, Eindhoven (NL)

(73) Assignee: NXP, B.V., Eindhoven (NL)

( * ) Notice: Subject to any disclaimer, the term of this patent is extended or adjusted under 35 U.S.C. 154(b) by 203 days.

(21) Appl. No.: 13/334,637

(22) Filed: Dec. 22, 2011

(65) Prior Publication Data

US 2012/0168840 A1   Jul. 5, 2012

(30) Foreign Application Priority Data

Jan. 5, 2011   (EP) .................................... 11150247

(51) Int. Cl.
*H01L 23/50*   (2006.01)
*H03F 3/68*   (2006.01)

(52) U.S. Cl.
USPC ........... 257/691; 257/329; 257/379; 257/579; 257/E23.01; 257/E23.079; 257/E29.114; 330/66; 330/295; 330/307; 361/309; 438/117; 438/411; 438/461

(58) Field of Classification Search
USPC .................... 257/329, 379, 579, 691, E23.01, 257/E23.079, E29.114; 330/66, 295, 307; 361/309; 438/117, 411, 461
See application file for complete search history.

(56) References Cited

U.S. PATENT DOCUMENTS

| | | | |
|---|---|---|---|
| 5,485,118 A | 1/1996 | Chick | |
| 6,614,308 B2 * | 9/2003 | Moller et al. | 330/295 |
| 8,106,503 B2 * | 1/2012 | Takagi | 257/691 |
| 8,258,014 B2 * | 9/2012 | Blair et al. | 438/117 |
| 2009/0309659 A1 | 12/2009 | Lender, Jr. et al. | |
| 2010/0140714 A1 * | 6/2010 | Ren et al. | 257/368 |
| 2010/0327398 A1 * | 12/2010 | Levy et al. | 257/508 |
| 2012/0038023 A1 * | 2/2012 | Ren et al. | 257/506 |

OTHER PUBLICATIONS

Aoki, I. et al. "Distributed Active Transformer-A New Power-Combining and Impedance-Transformation Technique", IEEE, Transactions on Microwave Theory and Techniques, vol. 50, No. 1, pp. 316-331 (Jan. 2002).

* cited by examiner

*Primary Examiner* — Dao H Nguyen

(57) ABSTRACT

An RF-power device includes a semiconductor substrate having a plurality of active regions arranged in an array. Each active region includes one or more RF-power transistors. The active regions are interspersed with inactive regions for reducing mutual heating of the RF-power transistors in separate active regions. The devices also includes at least one impedance matching component located in one of the inactive regions of the substrate.

14 Claims, 4 Drawing Sheets

RF-POWER DEVICE

CROSS-REFERENCE TO RELATED APPLICATIONS

This application claims the priority under 35 U.S.C. §119 of European patent application no. 11150247.2, filed on Jan. 5, 2011, the contents of which are incorporated by reference herein.

BACKGROUND OF THE INVENTION

This invention relates to a radio frequency (RF) power device.

It is known to provide RF power devices such as RF-LDMOS transistors and GaN-HEMT in an array on a semiconductor substrate.

Power devices of this kind generate a large amount of heat, which can lead to self heating and mutual heating between the devices in the array. This heating can lead to performance degradation or even transistor damage.

In an attempt to mitigate mutual heating of different transistors in the array, the transistors in known array designs are spaced apart by a given distance or pitch. The pitch used in practical devices is known to be 50-150 µm, whereas the size of the transistors themselves may be much smaller (e.g. 3-15 µm). The space in between the transistors represents a large amount dead space on the substrate in which the RF power device is provided.

Power transistors typically have a low input and output impedance. Accordingly, for certain applications, these power transistors are coupled to impedance matching circuits. These impedance matching circuits typically comprise components such as inductors and capacitors.

SUMMARY OF THE INVENTION

Aspects of the invention are set out in the accompanying independent and dependent claims. Combinations of features from the dependent claims may be combined with features of the independent claims as appropriate and not merely as explicitly set out in the claims.

According to an aspect of the invention, there is provided an RE-power device comprising:

- a semiconductor substrate having a plurality of active regions arranged in an array, wherein each active region comprises one or more RF-power transistors, and wherein the active regions are spaced apart by inactive regions for reducing mutual heating of the RF-power transistors in separate active regions; and
- at least one impedance matching component located in one or more of the inactive regions.

By providing impedance matching components in inactive regions of the substrate (which themselves serve to reduce mutual heating of RF-power transistors in separate active regions), space on the semiconductor substrate can be used more efficiently than is the case for known designs, where the impedance matching components are provided separately from the transistor array.

Since the space occupied by impedance matching components such as capacitors and inductors may be approximately as large as the inactive regions in which they are located, and since the inactive regions may typically be far larger than the active regions (so as to provide sufficient spacing of the active regions), it will be appreciated that the space savings made in accordance with an embodiment of the invention may be comparable in size to the total space occupied by the transistor array itself. The space saving is therefore significant.

For the purposes of this application, the terms "Radio Frequency" and "RF" refer to frequencies in the range 100 MHz≤f≤100 GHz.

Impedance matching components can be provided in a number of different configurations. In some examples, more than one component can be provided per inactive region. These components can be configured to provide input and/or output impedance matching for the device.

As used herein, the term "inactive region" refers to regions of the RF-power device that are not occupied by RF-power transistors. Accordingly, "inactive" refers to regions which are not active for the purpose of RF-power operation. It is therefore envisaged that components not forming part of the RF-power device may be provided in the inactive regions. Nevertheless, in other examples, the area on the substrate occupied by the inactive regions is devoid of components other than impedance matching components.

In one example, the inactive regions are bordered by the active regions. It will be appreciated that this allows the impedance matching components to be provided in close proximity to the transistors with which they are associated.

In one example, the device has a common gate connection and/or a common drain connection. These common connections connect together the gates and/or drains of a plurality of the RF-power transistors in separate active regions. One or more impedance matching components can be connected between the common gate connection and/or the common drain connection and a ground contact of the device. In another example, one or more impedance matching components can be connected between the common gate connection and the gate of at least one RF-power transistor and/or one or more impedance matching components can be connected between the common drain connection and the drain of at least one RF-power transistor. The inactive regions can be bordered by the common gate connection and/or the common drain connection.

As mentioned above, the inactive regions may occupy a greater area on the semiconductor substrate than the active regions. In particular, the inactive regions can occupy an area on the semiconductor substrate substantially 3 to 50 times greater than the area occupied by the active regions.

BRIEF DESCRIPTION OF THE DRAWINGS

Embodiments of the present invention will be described hereinafter, by way of example only, with reference to the accompanying drawings in which like reference signs relate to like elements and in which:

FIGS. 4 to 9 each show an RF-power device in accordance with an embodiment of the invention.

DETAILED DESCRIPTION

Embodiments of the present invention are described in the following with reference to the accompanying drawings.

Figure 1:
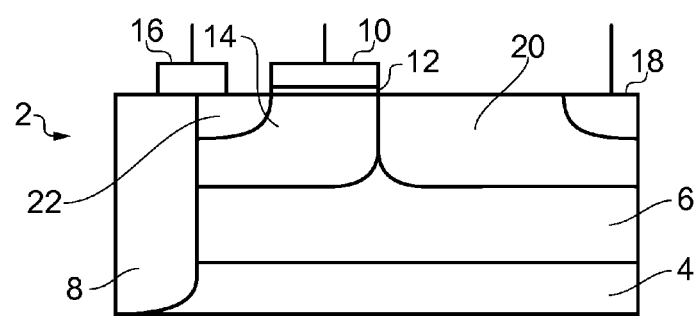
FIG. 1 shows an example of an RF-power transistor.

FIG. 1 shows a first example of an RF-power transistor 2. The RF-power transistor 2 is provided in a semiconductor substrate 4, and includes a source region 22 and a drain region 18. The source region 22 and the drain region 18 are provided in respective wells 14 and 20, which are formed in an epitaxial layer 6 on the substrate 4. The well 20 forms a drain drift region of the device. The well 14 forms a channel region of the device. As shown in FIG. 1, a contact 16 can be provided to connect to the source region 22 and the channel region of the well 14 to the substrate region 4 via a doped well region 8. Above the channel region in the well 14, there is provided a gate. The gate includes a dielectric 12 isolating a gate electrode 10 from the channel region.

This form of RF-power transistor is known in the art. Another version of this form of power transistor is illustrated in FIG. 2.

Figure 2:
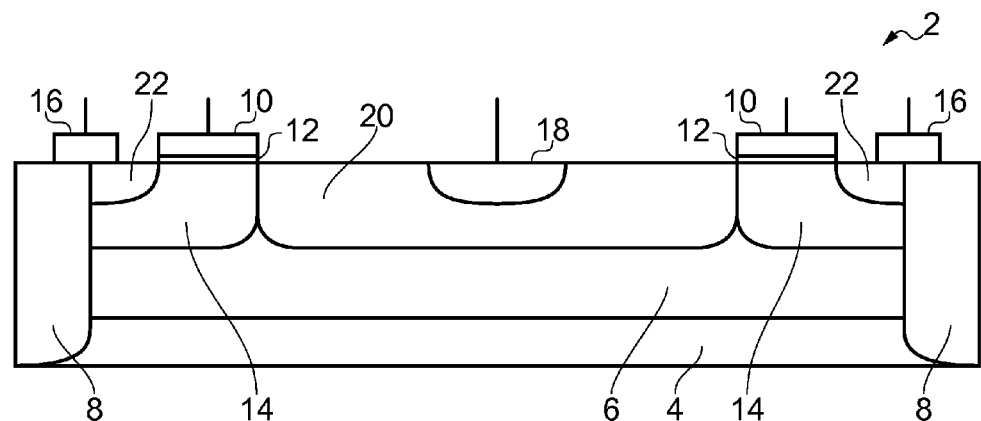
FIG. 2 shows another example of an RF-power transistor.

The RF-power transistor 2 shown in FIG. 2 comprises two transistors similar to those described above in relation to FIG. 1, with a shared drain region 18. The RF-Power transistor 2 in FIG. 2 thus includes two source regions 22 and two gates with respective gate dielectric 12 and gate electrodes 10.

Figure 5:
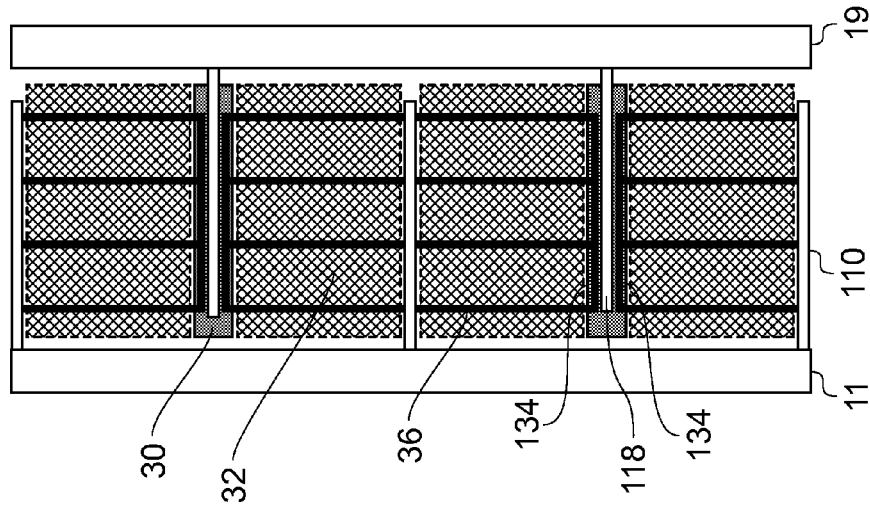
FIGS. 3 to 5 each show a number of different arrays of RF-power transistors provided in a semiconductor substrate.
Figure 4:
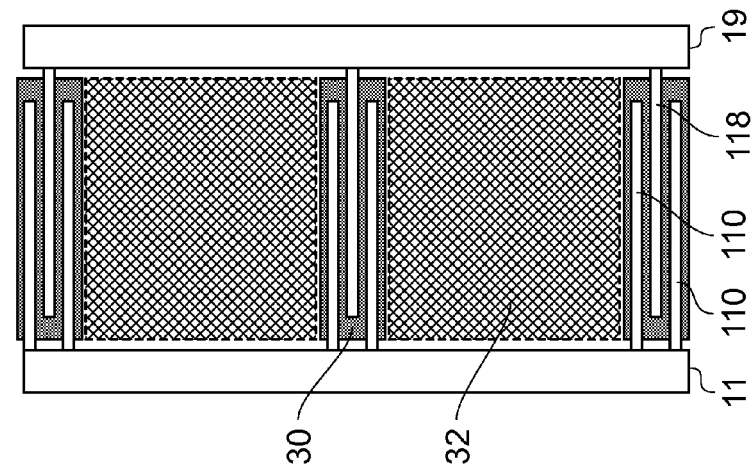
Figure 3:
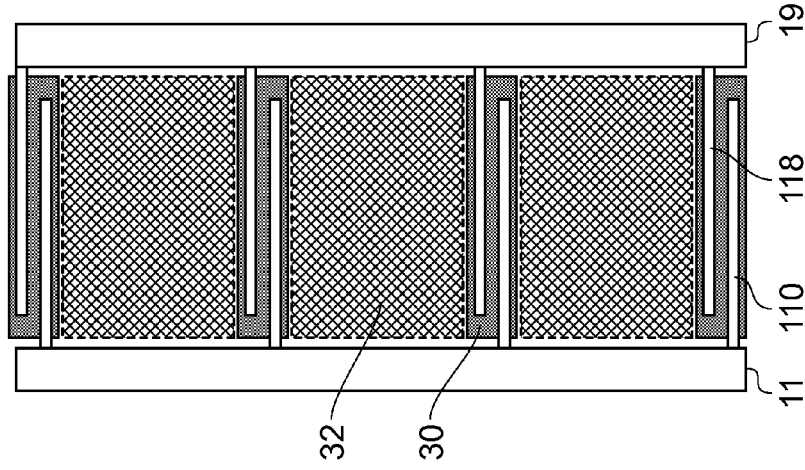

The RF-power transistors 2 in FIGS. 1 and 2 are shown in cross section. FIGS. 3 to 5 illustrate examples of these kinds of RF-power transistors incorporated into a transistor array in a substrate.

A first example of a RF-power transistor array is shown in FIG. 3. The array includes a number of active regions 30 in each of which, in this example, an RF-power transistor 2 of the kind described above in relation to FIG. 1 is provided. As described herein, for the purposes of this application, the terms "active region" refers to a region of a semiconductor substrate in which one or more RF-power transistors is provided. In this regard, contact wells such as the wells 8 shown in FIGS. 1 and 2 are not considered to be part of the power transistors, and indeed these wells may extend into the inactive regions 32 described below.

In FIG. 3, the top gate contact 110 of each RF-power transistor 2 in each active region 30 is illustrated in FIG. 3. Also shown in FIG. 3 is the top drain contact 118 of each RF-power transistor 2. The top gate contact and the top drain contact 118 generally situated above and provide connections to the gate contact 10 and the drain 18 of FIG. 1. For clarity, the components of the RF-power transistors 2 are not illustrated in FIG. 3.

As shown in FIG. 3, each active region 30 in the array is spaced apart (from an adjacent active region 30 in the array) by an inactive region 32. As described above, for the purposes of this application, the term "inactive region" in the first instance refers to a region of the semiconductor substrate which no components (such as RF-power transistors) which are active for the purposes of RF-power operation are present. In some examples, the inactive regions are devoid of any components of any kind, other than the impedance matching components as described herein below.

Nominally, the purpose of the inactive regions 32 is, as described above, to space apart the active regions 30 to mitigate against mutual heating of the RF-power transistors in adjacent active regions 30. However, and as described herein, in accordance with an embodiment of this invention, the inactive regions 32 can be usefully employed to accommodate impedance matching components such as capacitors and/or inductors, thereby saving space on the substrate.

In FIG. 3, it is further shown that the top gate contacts 110 of the RF-power transistors 2 in the various active regions 30 are connected together by a common gate 11. Similarly, the top drain contacts 118 of the RF-power transistors 2 in the various active regions 30 can also be connected together by a common drain 19.

FIG. 4 shows another example of a RF-power transistor array. The array in FIG. 4 is similar to that described above in relation to FIG. 3, except that the RF-power transistors 2 provided in the various active regions 30 are of the kind described above in relation to FIG. 2. Accordingly, and as shown in FIG. 4, the RF-power transistor 2 in each active region 30 includes two top gate contacts 110 and a shared top drain contact 118. As described above in relation to FIG. 3, in FIG. 4 the top gate contacts 110 are connected together using a common gate 11, and the shared top drain contacts 118 are connected together by a common drain 19. Also in common with the example of FIG. 3, the example in FIG. 4 includes inactive regions 32, which space apart the active regions 30 incorporating the RF-power transistors 2, to mitigate against mutual heating of the RF-power transistors 2.

A further example of a RF-power transistor array is shown in FIG. 5. The arrangement in FIG. 5 is similar to that shown in FIG. 4, except in the manner in which connections to the gate electrodes and drains of the transistors in the active regions 30 are made. In particular, the top gate contacts 110 in the example of FIG. 5 are not situated directly above the gate electrodes 10 of the transistors. Instead, the top gate contacts 110 extend across the device and are provided with lateral extensions 36. The lateral extensions 36 extend over the inactive regions 32 to connect with further contacts 134, which themselves are situated above the top gate electrodes 10 of the transistors. As the lateral extensions 36 are provided merely for the purpose of making electrical connections to the transistors, they are not considered to be part of the transistors themselves, and are not considered to be an active part of the device.

Figure 6:
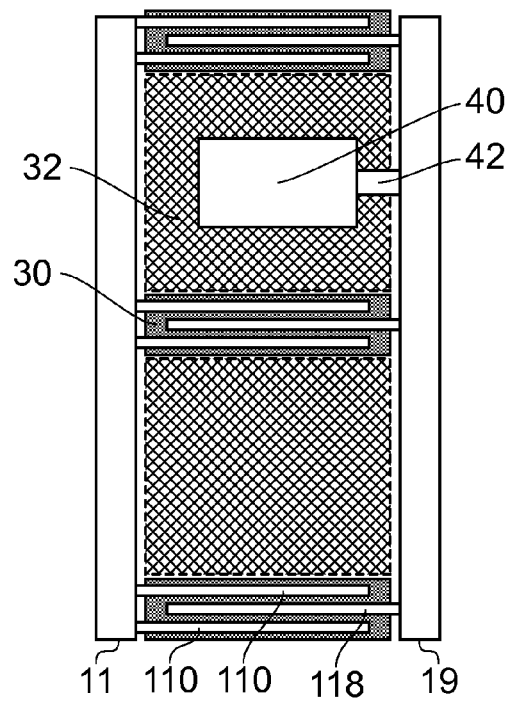

FIG. 6 illustrates a RF-power device according to an embodiment of the invention. The RF-power device in this example includes a plurality of active regions 30 arranged in an array. Each active region 30 includes one or more RF-power transistors 2. In the present example, the RF-power transistors 2 are of the kind described above in relation to FIG. 2. It will be appreciated that other kinds of RF-power transistors may be used in the active regions 30, and that the arrangement shown in FIG. 6 is merely an example. As described above in relation to FIG. 3 and FIG. 4, the top gate contacts 110 of the RF-power transistors 2 in this embodiment are connected together by a common gate 11. Similarly, the shared top drain contacts 18 of the RF-power transistor 2 in each active region 30 of the device are connected together by a common drain 19. It will be appreciated that the use of a common gate and/or a common drain is not essential to this invention, and in other examples one or more of the gates and/or drains of the RF-power transistors 2 of adjacent active regions 30 may be controlled separately.

The RF-power device of FIG. 6 also includes inactive regions 32, which space apart the active regions for reducing mutual heating of the RF-power transistors in separate active regions 30 as described above. Typically, the lateral dimension of the inactive regions 32 between adjacent active regions 30 may be in the range 50-150 microns. In comparison, the width of the active regions 30 in the same dimension may be of the order of 3-15 microns. Accordingly, it will be understood that in an RF-power device according to an embodiment of the invention, the inactive regions 32 may occupy an area on the semiconductor substrate that is substantially 3 to 50 times greater than the area occupied by the active regions 30. The actual pitch between adjacent active regions 30 may be chosen according to application requirements. For instance, the pitch may be chosen according to the anticipated degree of heating produced by the RF-power transistors 2 in each active region and the sensitivity of those RF-power transistors 2 to the effects of mutual heating. These considerations apply to each of the example embodiments described below in addition to the embodiment shown in FIG. 6.

The RF-power device shown in FIG. 6 further includes an impedance matching component 40, which is located in one of the inactive regions 32. The impedance matching component 40 can be employed for matching the impedance of the RF-power transistors 2 (either input or output) to external circuitry. As shown in FIG. 6, the impedance matching component 40 occupies a certain amount of space in one of the inactive regions 32. This amount of space represents a space saving, since in previous designs, the impedance matching component 40 would have been provided separately from the transistor array, whereby space for the transistor array and also the impedance matching component 40 would have had to have been provided on the substrate into which the array is incorporated.

In the example of FIG. 6, the impedance matching component 40 is connected via connection 42 to the common drain 19 for providing output impedance matching for the device. Although in this example the impedance matching component 40 is connected to the common drain at 19, in other examples, impedance matching components may be connected directly to the top drain contacts or shared top drain contacts 118 of the RF-power transistors 2 in the various active regions 30, while still being positioned in the inactive regions 32. Additionally, while in the present example the impedance matching component 40 is connected to the common drain 19 for providing output impedance matching, it will be appreciated that in other examples impedance matching components can be provided connected to the top gate contact 110 or common gate 11 of an RF-power device for providing input impedance matching for the device.

As described herein, the impedance matching component 40 may, for example, comprise a capacitor or an inductor. Moreover, the impedance matching component may include a combination of one or more capacitors or inductors, thereby to provide the desired matched impedance over a given frequency range of the device.

Figure 7:
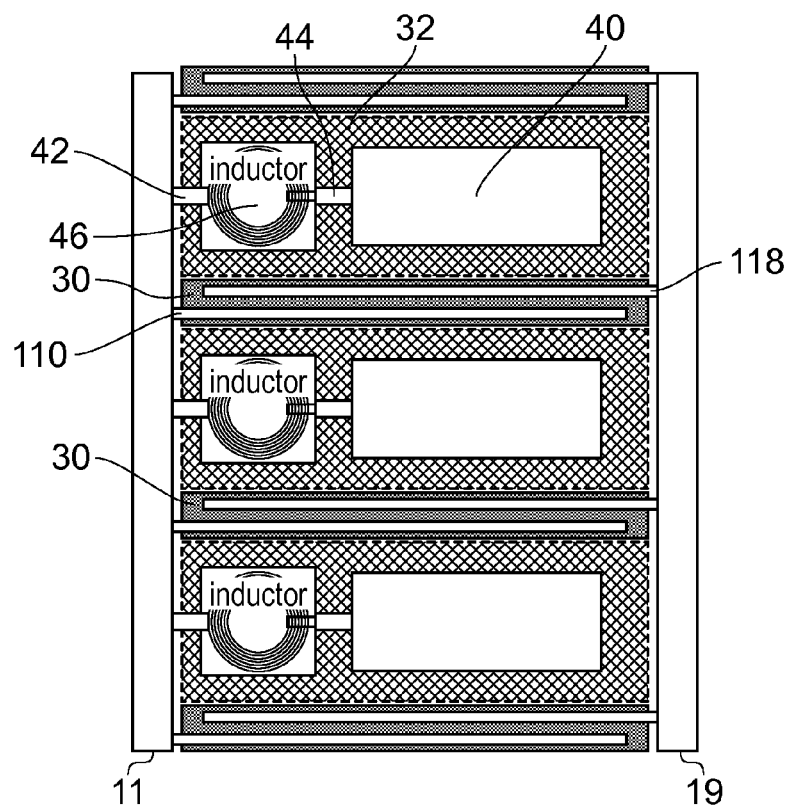

Another example of an RF-power device in accordance with an embodiment of the invention is shown in FIG. 7. The example in FIG. 7 includes active regions 30 which are provided with RF-power transistors 2 of the kind described above in relation to FIG. 1. As before, the provision of these kinds of RF-power transistors in the active regions merely constitutes an example, and other kinds of RF-power transistors may be used.

In the example of FIG. 7, impedance matching components 40 and 46 are located in the inactive regions 32. In contrast to the example of FIG. 6, more than one inactive region 32 in the device of FIG. 7 is populated with impedance matching components. Also, in contrast to FIG. 6, the impedance matching components 40 and 46 in FIG. 7 are connected to the common gate 11 of the device for providing input impedance matching. The impedance matching components 40 and 46 are connected together via connection 44 and are connected to the common gate via connection 42. In the present example, the impedance matching component 46 comprises an inductor, while the impedance matching component 40 comprises a capacitor, which itself may be connected to ground (using connections not illustrated in FIG. 7).

Accordingly, FIG. 7 illustrates that more than one impedance matching component may be provided in each inactive region 32 and that more than one inactive region 32 of the RF-power device may be populated with impedance matching components such as capacitors and/or inductors.

Figure 8:
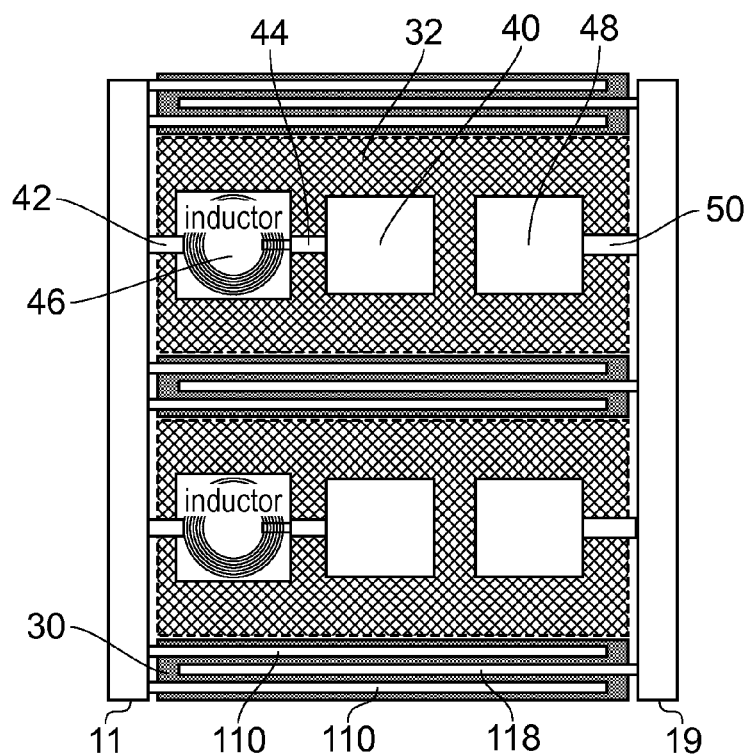

A further example of an RF-power device in accordance with the embodiment of this invention as shown in FIG. 8. In common with the example described above in relation to FIG. 6, the example of FIG. 8 employs RF-power transistors of the kind described above in relation to FIG. 2. As ever, other types of RF-power transistors may be employed. In FIG. 8, each inactive region 32 is populated with a number of impendence matching components 40, 46 and 48. The impedance matching components 40 and 46 take on a similar configuration to the impedance matching components described above in relation to FIG. 7. The impedance matching component 48 shown in FIG. 8 is configured similarly to the impedance matching component 40 described above in relation to FIG. 6.

Accordingly, FIG. 8 illustrates that the inactive regions 32 of an RF-power device in accordance with an embodiment of the invention can be populated with impedance matching components, some of which provide input impedance matching and some of which provide output impedance matching.

Figure 9:
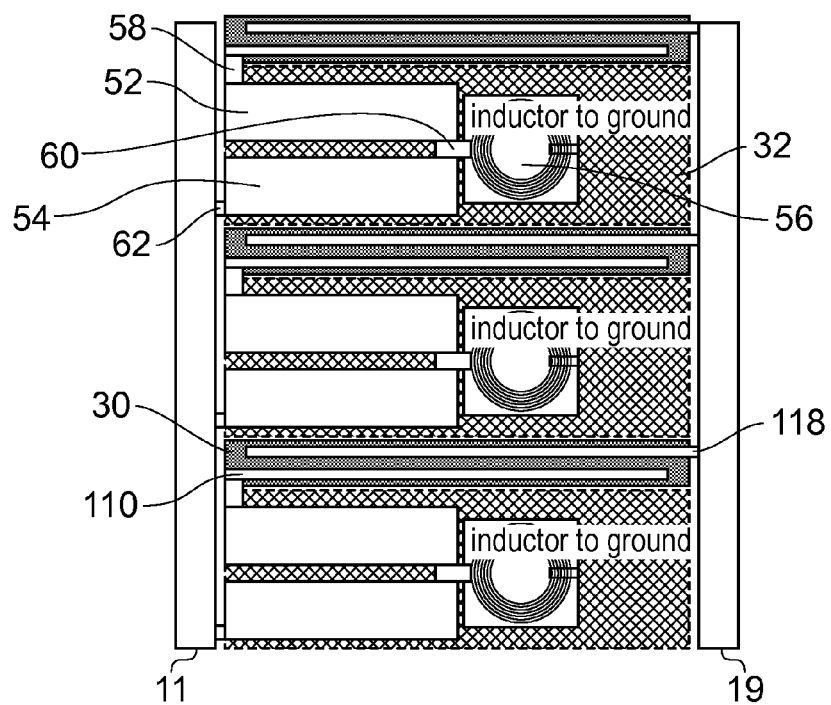

A further example of an RF-power device in accordance with an embodiment of this invention is shown in FIG. 9. The example in FIG. 9 employs RF-power transistors of the kind described above in relation to FIG. 1, but again any kind of RF-power transistor may be used instead. The impedance matching components described above in relation to FIGS. 6, 7 and 8 are typically terminated to ground. For example, the capacitors 40 and 48 described above in relation to FIG. 8 may typically be connected to ground. However, in the example of FIG. 9, it is shown that a number of impedance matching components can be connected between a common gate 11 of the device and the various respective top gate contacts 110 of the RF-power transistors in the active regions 30. In other examples, it is envisaged that one or more impedance matching components may be provided in connection between the common drain 19 of an RF-power device and the various top drain contacts or shared top drain contacts 118 of the RF-power transistors in the active regions 30.

In the present example, the impedance matching components include two capacitors 52 and 54 and an inductor 56. Other combinations of impedance matching components may of course be employed. While the impedance matching components are generally connected between the common gate 11 and the respective top gate contacts 110 of the RF-power transistors 2, one or more of those components may also be connected to ground. For example, the inductor 56 in each inactive region 32 in the example of FIG. 9 is indeed connected to ground.

Accordingly, the example of FIG. 9 illustrates that various combinations of impedance matching components connected either directly to ground and/or connected between a common gate (or) drain and the various top gate contacts (or top drain contacts or shared top drain contacts) of the device may be provided.

In each of the examples described above, space on the semiconductor substrate of the device is saved because the impedance matching components themselves occupy previously unused areas on the semiconductor substrate, namely the inactive regions 32. Another advantage of providing the impedance matching components in the inactive regions 32 is that the impedance matching components are provided in close proximity to the parts of the RF-power transistors to which they are connected. Accordingly, connections such as those shown in FIG. 9 (58, 62 and 60) can be made short, and with a compact configuration. This advantage arises because the inactive regions 32 of the device are boarded by the active regions 30 of the device, whereby the RF-power transistors in the active regions are by definition provided in close proximity to any impedance matching components which are located in the inactive regions 32. Similar considerations apply in respect of the common gate and/or common drain—where these are provided, they may be provided in a position which boarders the inactive regions 32 of the device.

Accordingly, there has been described an RF-power device includes a semiconductor substrate having a plurality of active regions arranged in an array. Each active region includes one or more RF-power transistors. The active regions are interspersed with inactive regions for reducing mutual heating of the RF-power transistors in separate active regions. The devices also includes at least one impedance matching component located in one of the inactive regions of the substrate.

Although particular embodiments of the invention have been described, it will be appreciated that many modifications/additions and/or substitutions may be made within the scope of the claimed invention.

The invention claimed is:

1. An RF-power device comprising:
   a semiconductor substrate having a plurality of active regions arranged in an array, wherein each active region comprises one or more RF-power transistors, and wherein the active regions are spaced apart by inactive regions for reducing mutual heating of the RF-power transistors in separate active regions; and
   at least one impedance matching component located in one or more of the inactive regions wherein the impedance matching component is arranged to match the impedance of the RF-power transistors to external circuitry.

2. The device of claim 1 comprising a plurality of impedance matching components located in one of the inactive regions of the substrate.

3. The device of claim 2 comprising a plurality of impedance matching components in each of a plurality of inactive regions of the substrate.

4. The device of claim 1, wherein the inactive regions are devoid of components other than impedance matching components.

5. The device of claim 1, wherein the inactive regions are bordered by the active regions.

6. The device of claim 1 comprising a common gate connection and/or a common drain connection for the gates and/or drains of at least two RF-power transistors in separate active regions.

7. The device of claim 6 comprising one or more impedance matching components connected between the common gate connection and/or the common drain connection and a ground contact of the device.

8. The device of claim 6 comprising one or more impedance matching components connected between the common gate connection and the gate of at least one RF-power transistor and/or one or more impedance matching components connected between the common drain connection and the drain of at least one RF-power transistor.

9. The device of claim 6, wherein the inactive regions of said device are bordered by the common gate connection and/or the common drain connection.

10. The device of claim 1 comprising one or more impedance matching components comprising a capacitor or an inductor.

11. The device of claim 1, wherein the inactive regions occupy a greater area on the semiconductor substrate than the active regions.

12. The device of claim 11, wherein the inactive regions occupy an area on the semiconductor substrate substantially 3 to 50 times greater than the area occupied by the active regions.

13. The device of claim 1, wherein the impedance matching components provide input impedance matching for the device.

14. The device of claim 1, wherein the impedance matching components provide output impedance matching for the device.

* * * * *